United States Patent
Reindl

(10) Patent No.: US 6,747,496 B2
(45) Date of Patent: Jun. 8, 2004

(54) DLL-(DELAY-LOCKED-LOOP) CIRCUIT

(75) Inventor: Christian Reindl, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/341,503

(22) Filed: Jan. 13, 2003

(65) Prior Publication Data

US 2003/0141910 A1 Jul. 31, 2003

(30) Foreign Application Priority Data

Jan. 25, 2002 (DE) .......................... 102 02 879

(51) Int. Cl.7 ................................................ H03L 7/06
(52) U.S. Cl. ...................................... 327/156; 327/158
(58) Field of Search ............................... 327/156, 158, 327/146, 147, 157

(56) References Cited

U.S. PATENT DOCUMENTS 5,970,110 A  10/1999  Li ................................ 327/147
6,259,288 B1 *  7/2001  Nishimura ................. 327/156
6,614,287 B1 *  9/2003  Gauthier et al. ............ 327/157
2002/0000855 A1  1/2002  Lee

* cited by examiner

Primary Examiner—Dinh T. Le
(74) Attorney, Agent, or Firm—Welsh & Katz, Ltd.

(57) ABSTRACT

The present invention provides a Delay Locked Loop circuit having: a delay device for generating at least one delayed clock signal from an input clock signal; a phase detector for comparing the delayed clock signal with the input clock signal; a first control device for generating a first control signal for influencing a delay time of the delay device; a device for generating a signal Q, whose frequency is proportional to the reciprocal of the delay time of the delay device; a device for evaluating the signal Q and generating an output signal; and a second control device for modifying the first control signal in accordance with the output signal. The present invention likewise provides a method for generating a control signal of a Delay Locked Loop circuit.

23 Claims, 5 Drawing Sheets

DLL-(DELAY-LOCKED-LOOP) CIRCUIT

FIELD OF THE INVENTION

The present invention relates to a DLL (Delay-Locked Loop) circuit.

BACKGROUND OF THE INVENTION

In a DLL circuit, assuming a large frequency range of the input clock, the problem arises that the delay time of the delay line in the locked state of the circuit can amount to a clock period of the input clock or else an integer multiple thereof. With the aid of a DLL circuit, it is possible to subdivide a clock period of the input clock into a plurality of phases. Various square-wave signals can then be derived from these phases with the aid of an additional logic.

A previously known solution is described in more detail in the Canadian document CA 2309522-A1, published on Jun. 22, 2001. An apparatus and a method are presented, which are distinguished by counting of the rising edges within the delay line, during a clock period of the input clock. A further known solution is based on the use of a replica delay line and was published with the title "An all-analog multiface delay-locked loop using a replica Delayline for wide-range operation and low-jitter performances" in IEEE Journal of Solid-State-Circuits, Vol. 35, No. 3, March 2000.

FIG. 1 illustrates a block diagram of a customary DLL (Delay-Locked Loop) circuit. In the locked state, a delayed input clock signal 7 (clkd) is delayed exactly one period duration with respect to the input clock signal 6 (clk). If the delay of the delay device 1 changes, a phase shift arises between the input clock signal 6 (clk) and the delayed input clock signal 7 (clkd). This phase shift is identified by the phase detector 2, whereupon the latter causes an electrical energy source 3, for example a charge pump 3, to send current pulses into a filter device 4. On account of this, a feedback signal 5 changes and the regulating voltage for changing the delay time (delay) at the input of the delay device 1 alters the delay time of the delay line 1, so that the phase shift between the input clock signal 6 (clk) and the delayed input clock signal 7 (clkd) decreases again.

However, if the input frequency can vary in a large range, which is equivalent to a large change range of the delay time (delay), it is possible, in the locked state, for the delayed input clock 7 clkd to be delayed by an integer multiple of the period duration of the input clock 6 with respect to the input clock signal 6. This represents an unacceptable state and should be prevented.

SUMMARY OF THE INVENTION

It is an object of the present invention to provide a DLL circuit which, despite a large input frequency range of the input clock, ensures that the delay time of the delay line in the locked state amounts to precisely one clock period. It is likewise an object of the present invention to provide a method for operating a DLL circuit in order to ensure that the delay time of the delay line in the locked state amounts to only one clock period of the input clock.

According to the invention, this object is achieved by means of the DLL circuit specified in claim 1 and by means of the method according to claim 20.

The idea on which the present invention is based consists in generating a signal Q, whose frequency is approximately proportional to the reciprocal of the delay time (delay), and deriving a further signal from the signal Q, from which the fact of whether the delay of the delay device lies in the region of a period duration of the input clock can be identified.

In the present invention, the problem mentioned in the introduction is solved in particular by virtue of the fact that a superordinate regulating circuit is placed above a standard DLL regulating circuit and identifies whether the delay between the input clock signal (clk) and a delayed input clock signal (clkd) lies in the region of a period duration. If that is not the case, then the superordinate regulating circuit intervenes in order to minimize the regulation deviation. If the delay between the input clock (clk) and the delayed input clock (clkd) is in the region of a period duration of the input clock, then the subordinate standard DLL regulating circuit corrects the regulation deviation.

Advantageous developments and improvements of the respective subject matter of the invention can be found in the subclaims.

In accordance with one preferred development, the device for generating the signal Q has a flip-flop chain comprising more than two flip-flops, which exhibit feedback via an inverter.

In accordance with a further preferred development, the device for generating the signal Q has exactly one delay element of the delay device in circuitry terms between two flip-flops of the flip-flop chain.

In accordance with a further preferred development, a signal evaluation device has a device for comparing frequencies.

In accordance with a further preferred development, the signal evaluation device has a device for identifying a state change, in particular in the device for generating the signal Q.

In accordance with a further preferred development, a DLL circuit has both a state detection device and a frequency comparison device.

CONCISE DESCRIPTION OF THE DRAWINGS

Exemplary embodiments of the invention are illustrated in the drawings and explained in more detail in the description below.

DETAILED DESCRIPTION OF SEVERAL EMBODIMENTS OF THE INVENTION

In the figures, identical reference symbols designate identical or functionally identical constituent parts.

Figure 1:
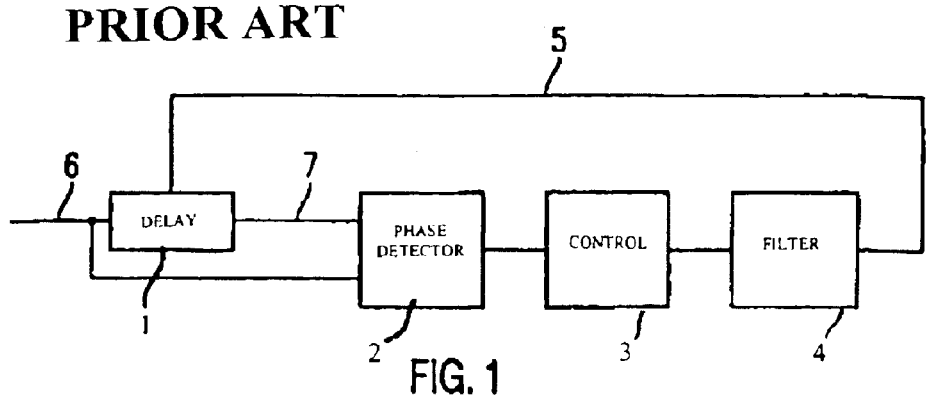
FIG. 1 shows the block diagram of a customary DLL circuit.
Figure 2:
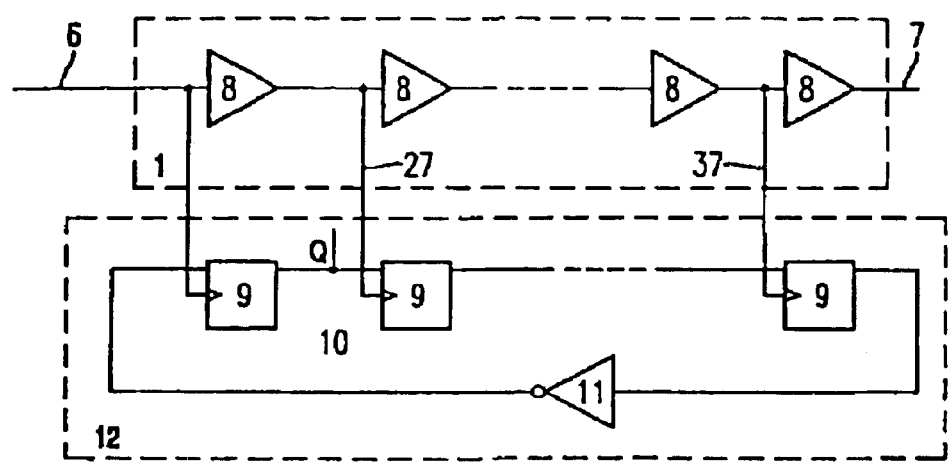
FIG. 2 shows the block diagram of a detail from a DLL circuit for elucidating an embodiment of the present invention.

FIG. 2 shows the block diagram of a detail from a DLL circuit for elucidating an embodiment of the present invention.

FIG. 2 illustrates a circuit for converting the delay time (delay) into a frequency or into a signal Q, which essentially has a flip-flop chain 10, which exhibits feedback via an inverter 11. After a reset, all the flip-flops 9 are reset. On account of the inverter 11, a high level is present at the input of the first flip-flop 9. The positive edges of a delayed clock signal 7 which are present in a delayed fashion at the outputs of delay elements 8 (delay cells), switch the outputs of the flip-flops 9 to a high level in order. After a positive edge has passed through the delay device 1 (delay line) all the flip-flop outputs are at a high level, whereupon a low level is present at the input of the first flip-flop 9 on account of the inverter 11. A low level signal is thereupon passed through the flip-flop chain 10 with the next positive edge.

Consequently, it emerges that the signal Q in the locked state (delay time of the delay device 1 (delay line) is a period of the input clock 6 (clk)) has half the frequency of the input clock 14. It likewise follows from the circuit that the signal Q changes its state at the same time (strictly speaking shifted by a flip-flop transit time) at a positive edge of the input clock 6 (clk).

The delay device 1 (delay line) is configured in such a way that the delay time (delay) lies within the range in which locking is possible. The largest possible capture range is achieved if only one delay device 8 (delay cell) is connected between two flip-flops 9. The signal Q thus has a frequency which is approximately proportional to one of the delay time. The signal Q can also be tapped off further back in the flip-flop chain 10, it being possible to omit flip-flops 9 at the start and at the end of the flip-flop chain 10 and it not being necessary for a flip-flop 9 to occur in circuitry terms after each delay device 8 (delay cell).

Figure 3:
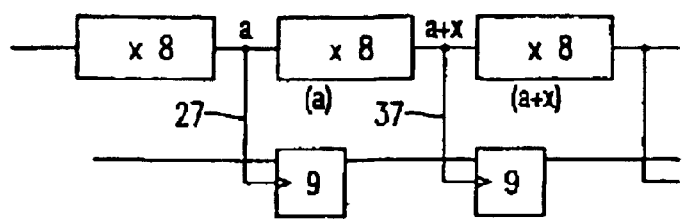
FIG. 3 shows the block diagram of a detail from the device for converting the delay time into a frequency according to FIG. 2 for elucidating an embodiment of the present invention.

FIG. 3 shows the block diagram of a detail from the device for converting the delay time into a frequency for elucidating an embodiment according to FIG. 2 of the present invention.

Figure 4:
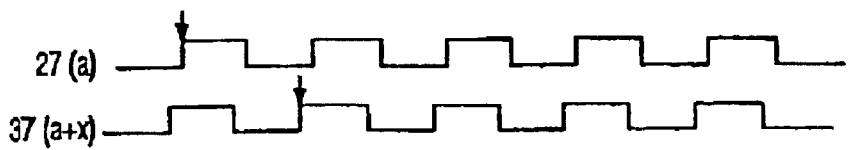
FIG. 4 shows two square-wave signals with a delay time less than a period for elucidating the function of an embodiment of the present invention.
Figure 5:
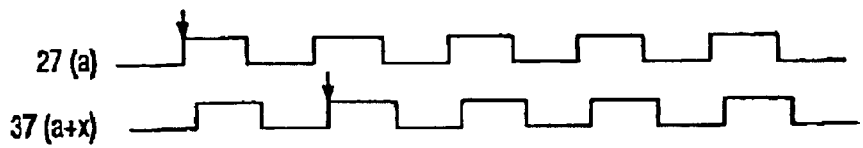
FIG. 5 shows two square-wave signals with a delay time greater than a period duration for elucidating an embodiment of the present invention.

FIG. 3 shows, in connection with FIG. 4 and FIG. 5, the function of the device for converting the delay time into a frequency. The arrow tip in FIGS. 4 and 5 marks the same rising clock edge at different times at the locations a and a+x in the delay device 1 (delay line) according to FIG. 3. If the delay between the two delayed clock signals 27 and 37 (clkd(a) and clkd (a+x)) is less than a clock period of the input clock 6 (clk), then a high level, for example, at the output of the first flip-flop 9 is accepted by the second flip-flop 9 after the delay time.

In the illustration according to FIG. 5, the delay time between the two delayed clocks 27 and 37 (clkd(a) and clkd(a+x)) is somewhat greater than a clock period of the input clock 6. Consequently, a high level at the output of the first flip-flop 9 is accepted too early by the second flip-flop 9, to be precise already at the point designated by the thick black oval. Consequently, a high level (or a low level) passes through the flip-flop chain 10 too quickly and an excessively short delay time is simulated.

With two flip-flops 9, a delay time of at most one clock period can be identified correctly from the location a as far as the location a+x. If all the delay elements 8 (delay cells) have approximately the same delay time the maximum delay time of the delay device 1 (delay line) which can still be identified correctly is as per the equation: period duration of clock * (number of flip-flops 9 in the flip-flop chain 10–1).

In this circuit, the frequency of the signal Q is at most half the input clock frequency 14, because high levels or low levels are passed through the flip-flop chain 10 only with the rising clock edge, beginning from left to right in FIG. 2. If the passage of the rising clock edge lasts longer than one clock period, then the signal Q changes the state only after every second (or third etc.) rising clock edge. The frequency of the signal Q is then lower.

In order to realize the circuit according to FIG. 2, more than two flip-flops 9 are preferably inserted into the flip-flop chain 10. If it is assumed, for example, that there are two flip-flops 9 with a delay cell 8 located in between, then the maximum frequency of the signal Q is equal to half the input clock frequency 14. If the delay time of the delay elements 8 is then increased to an extent such that the correct delay time can still just be identified by the two flip-flops 9, then the frequency of the signal Q is still half the clock frequency.

By contrast, if a plurality of flip-flops 9 are used in the flip-flop chain 10, a lower frequency is obtained for the signal Q. In this case, the frequency of the signal Q thus contains an item of information about the delay time of the delay device 1 (delay line).

Figure 6:
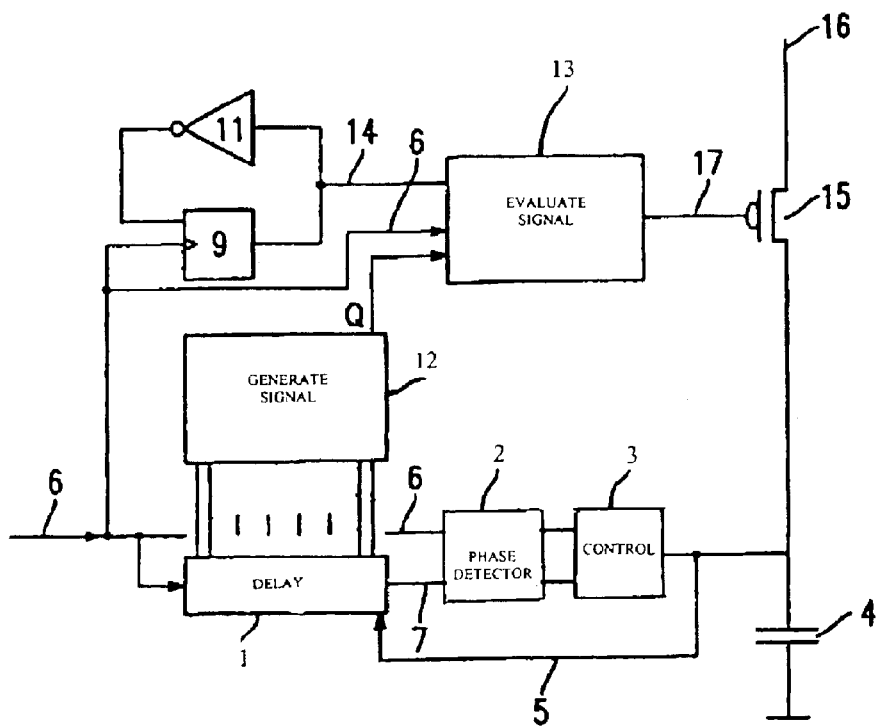
FIG. 6 shows a block diagram of a DLL circuit for elucidating a first embodiment of the present invention.

FIG. 6 shows the block diagram of a DLL circuit for elucidating a first embodiment of the present invention.

FIG. 6 illustrates a DLL circuit with a superordinate regulating circuit. The superordinate regulating circuit has a device 12 for converting the delay time (delay) into a frequency, a device 13 for comparing frequencies and a first control device 15 in addition to standard DLL elements such as a delay device 1 (delay line), a phase detector 2, a first electrical energy source 3, in particular a charge pump 3, and a filter device 4, whose output voltage serves as feedback signal 5 or regulating voltage for changing the delay time (delay). The signal Q is generated in the device 12 for converting the delay time (delay) into a frequency, the frequency of which signal Q is approximately proportional to the delay of the delay device 1 (delay line). The signal Q is compared with a clock signal 14 having half the input clock frequency in the device 13 for comparing frequencies, which clock signal is generated from the input clock 6 by means of a flip-flop 9 and an inverter 11 exhibiting feedback thereto.

If the frequency of the signal Q is lower, then the output signal 17 has a low level and the control device 15, in particular a switch (for example a field-effect transistor), remains turned on. As a result, the filter device 4 (for example a capacitance) is charged and the regulating voltage 5 (Vr) rises. As a result, the delay of the delay device 1 decreases and the frequency of the signal Q increases.

If the frequency of the signal Q is equal to half the input clock frequency 6, then the output signal 17 changes to a high level and the switch 15 is turned off. This is followed by a fine regulation of the delay time of the delay device 1 by the phase detector 2 (PD) and the electrical energy source 3 (charge pump).

Figure 7:
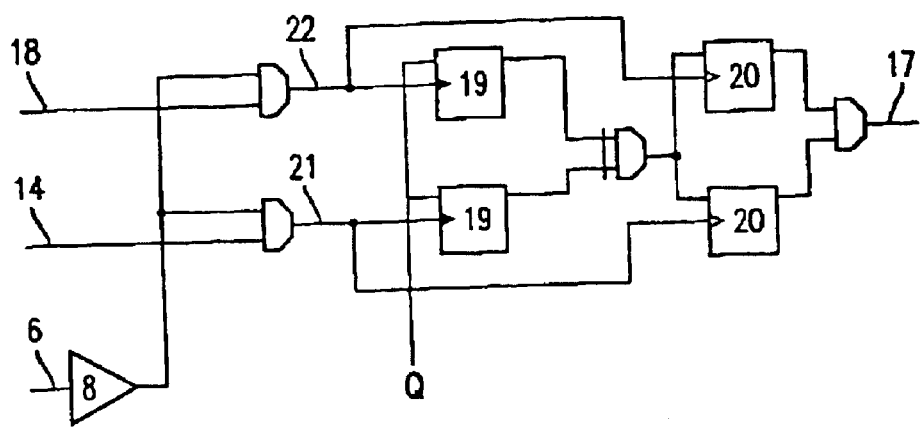
FIG. 7 shows the block diagram of a detail from the circuit according to FIG. 6 for elucidating the first embodiment of the present invention.

FIG. 7 shows the block diagram of a device for comparing frequencies in accordance with an embodiment of the present invention.

Figure 8:
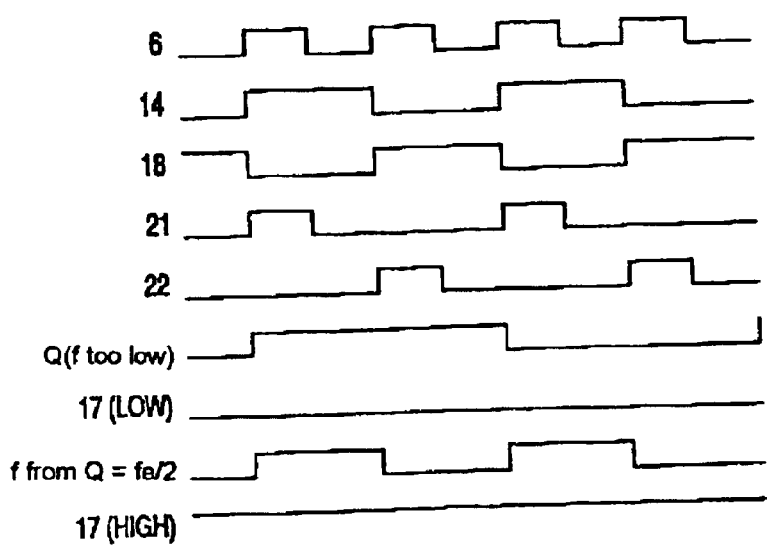
FIG. 8 shows square-wave signals of the circuit according to FIG. 7 for elucidating the function of the first embodiment of the present invention.

The diagram according to FIG. 8 serves for elucidating the method of operation of the circuit in accordance with FIG. 7 in greater detail. FIG. 7 illustrates three AND gates, two negative edge triggered flip-flops 19, two positive edge triggered flip-flops 20, an EXOR gate and a delay element 8. If the frequency of the signal Q is equal to half the input clock frequency 14, then the output of one negative edge triggered flip-flop 19 is at a high level and the output of the other negative edge triggered flip-flop 19 has a low level. It follows from this that the output of the EXOR gate always has a high level, and so the output signal 17, too, always has a high level and the switch 15 turns off.

If the frequency of the signal Q has a value which is less than half the frequency of the input clock 14, then at least one output of the two positive edge triggered flip-flops 20 is at a low level. Consequently, the output signal 17 of the frequency comparison is also at a low level and the switch 15 turns on. The delay element 8 (delay) prevents glitches (interference pulses of very short duration) in the clock signals 21, 22 (clk1, clk2).

If the frequency of the signal Q is equal to half the input clock frequency 14, then this means that the delay of the delay device 1 lies in the region of a clock period of the input clock signal 6 (clk), the output signal 17 of the frequency comparison switches to a high level, the switch 15 inhibits the electrical energy source 16 and thus prevents a charge exchange with the filter device 4. The phase detector 2 and the charge pump 3 in accordance with FIG. 6 are activated at the same time. Fine regulation of the delay of the delay device 1 is then effected by means of the phase detector 2 and the charge pump 3.

Figure 9:
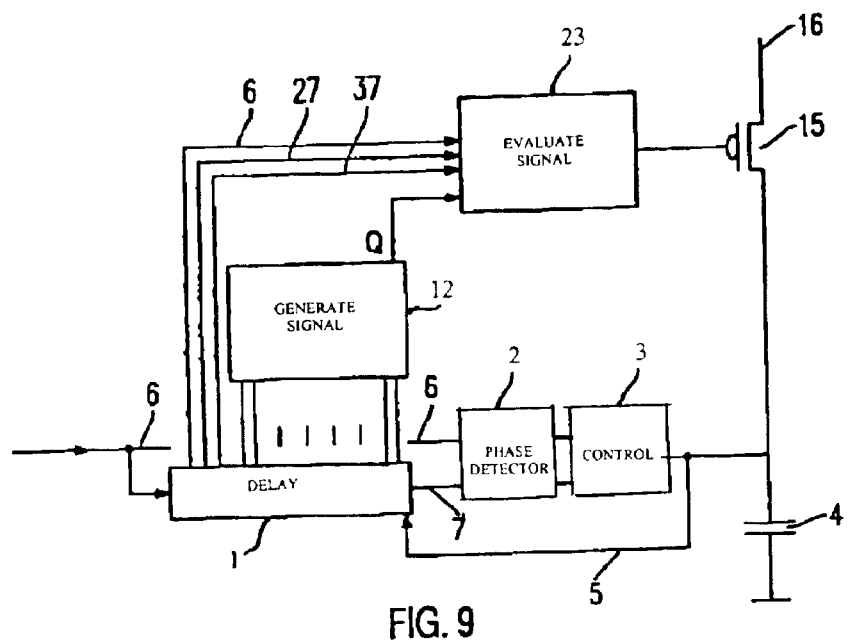
FIG. 9 shows the block diagram of a DLL circuit for elucidating a second embodiment of the present invention.
Figure 10:
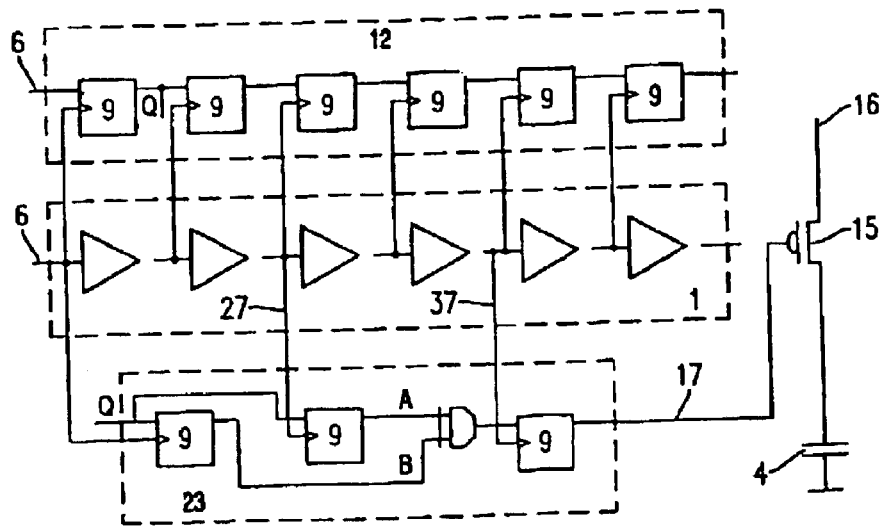
FIG. 10 shows the block diagram of a detail from the circuit according to FIG. 10 for elucidating the second embodiment of the present invention.

FIG. 9 shows the block diagram of a DLL circuit for elucidating a second embodiment of the present invention, and FIG. 10 illustrates the block diagram of a detail for elucidating the second embodiment of the present invention.

If, while a rising edge of the clock runs through the delay device 1, the signal Q in accordance with the block diagram according to FIG. 10 has no state change, i.e. Q has a constant high or low level in successive clock sequences, it follows from this that A=B and, consequently, the output signal 17 has a low level. The filter device 4 is thus charged, the regulating voltage 5 for changing the delay time increases and, as a result, the delay time of the delay device 1 decreases.

If a state change takes place in the signal Q while a rising edge of the clock runs through the delay device 1, then A and B are the inverse of one another, the output signal 17 of the state change detection assumes a high level and the switch 15 turns off.

If the delay time of the delay device 1 is very long, the signal Q makes a state change only every few clock periods of the input clock. The switch 15 is therefore usually switched on in this case and the filter device 4 (capacitor) is charged. If the delay time of the delay is less than or equal to the period duration of the input clock 6, a permanent state change takes place (with the frequency of the input clock), the output signal 17 remains at a high level and the switch 15 is thus switched off.

If the case arises where the delay time between the clocks of two successive flip-flops 9 in the flip-flop chain 10 is too short, the flip-flops 9 can no longer switch, and the signal Q is thus constant. This results in the frequency comparison device 13 detecting an excessively low frequency. As a result, the delay time is reduced still further, and the DLL circuit does not lock.

This problem can be solved by a conscientious design of the delay device 1 (delay line). In the configuration of the delay device 1, it must be taken into account that the delay cannot become too short.

The solution to this problem is complex at high frequencies, which correspond to a short delay time, and if a large "capture range" is required, which is equivalent to the need for many flip-flops 9 in the flip-flop chain 10. The problem area is that the "minimum delays" on the one hand must not become too short, since otherwise the flip-flops 9 could no longer switch, but on the other hand the "minimum delay" must not become too long, since otherwise a high frequency cannot be achieved. This means that the allowed variation range of the "minimum delay" is very small which is difficult to achieve on account of the large parameter variation in CMOS circuits.

With the aid of the circuit according to FIG. 10, it is possible to detect whether a state change takes place in the delay device 1 (delay line). If no state change is detected, the delay time of the delay device 1 (delay line) is evidently too short.

Figure 11:
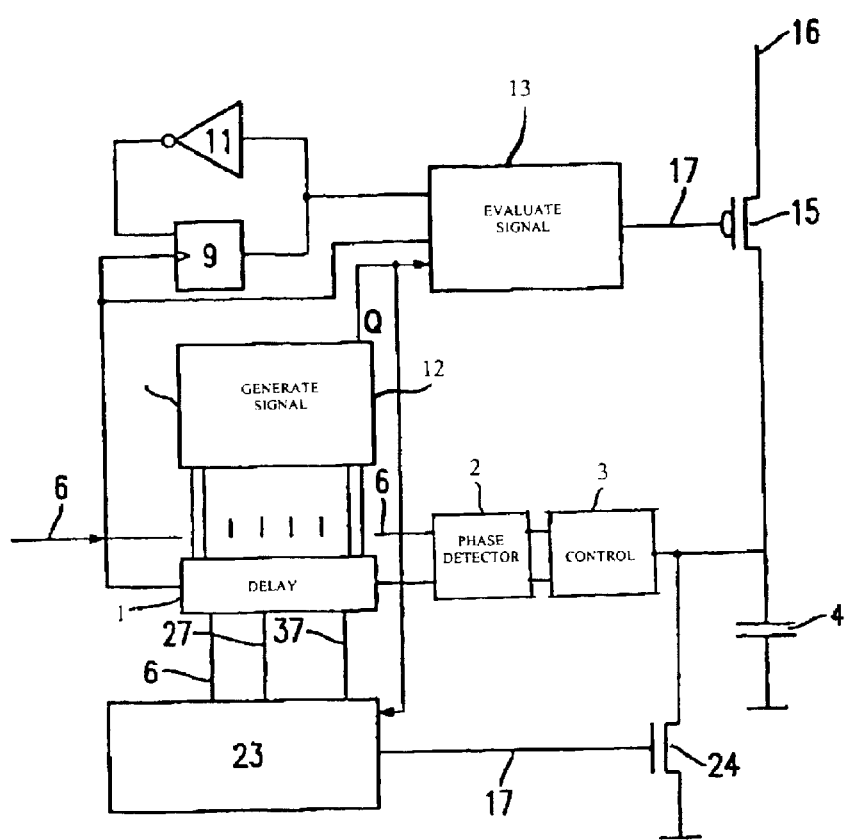
FIG. 11 shows the block diagram of a DLL circuit for elucidating a third embodiment of the present invention.

The block diagram of a DLL circuit illustrated in FIG. 11 serves for elucidating a third embodiment of the present invention.

The last-mentioned problem area can be solved using a circuit in accordance with FIG. 11. Via the control device 24, in particular a transistor, the filter device 4 (for example a capacitor) can be discharged again until the delay time again has a sufficiently large value. The control devices 15 and 24 can also be neutrally latched in order to avoid simultaneous charging and discharging of the filter device 4.

Although the present invention has been described above using preferred exemplary embodiments, it is not restricted thereto, but rather can be modified in diverse ways.

Although concrete circuit blocks, elements and logic gates and also signal waveforms (square-wave signals) and regulating variables (e g. the regulating voltage for changing the delay) have been described in the above exemplary embodiments, other elements are also conceivable for realizing the functions according to the invention.

The invention is also not restricted to the application possibilities mentioned.

What is claimed is:

1. A Delay Locked Loop circuit having:
    a delay device for generating at least one delayed clock signal from an input clock signal;
    a phase detector for comparing the delayed clock signal with the input clock signal;
    a first control device connected to said phase detector for generating a first control signal for influencing a delay time of the delay device;
    a device for generating a signal Q, whose frequency is proportional to the reciprocal of the delay time of the delay device;
    a device connected to said device for generating a signal Q for receiving the signal Q and generating an output signal; and
    a second control device connected to said device for receiving the signal Q for adjusting the frequency of the first control signal in accordance with the output signal.

2. A Delay Locked Loop circuit according to claim 1, wherein the device for generating the signal Q has a flip-flop chain comprising at least two flip-flops, which exhibits feedback via an inverter.

3. A Delay Locked Loop circuit according to claim 2, wherein the device for generating the signal Q is connected to clock signals from the delay device at the clock inputs of the flip-flops.

4. A Delay Locked Loop circuit according to claim 2, wherein the signal Q is tapped off at an arbitrary location downstream of the first flip-flop in the flip-flop chain.

5. A Delay Locked Loop circuit according to claim 2, wherein the flip-flops of the flip-flop chain are positive edge triggered D-type flip-flops.

6. A Delay Locked Loop circuit according to claim 2, wherein at least one delay element of the delay device is located between two flip-flops of the flip-flop chain.

7. A Delay Locked Loop circuit according to claim 6, wherein exactly one delay element of the delay device is located in circuitry terms between two flip-flops of the flip-flop chain in order to generate the largest possible capture range of the DLL circuit.

8. A Delay Locked Loop circuit according to claim 1, wherein the signal evaluation device has a device for comparing frequencies.

9. A Delay Locked Loop circuit according to claim 8, wherein the device for comparing frequencies is fed with an said input clock signal, a half-frequency input signal and the signal Q.

10. A Delay Locked Loop circuit according to claim 8, wherein the device for comparing frequencies has a delay element, positive edge triggered flip-flops, negative edge triggered flip-flops, AND gates and EXOR gate.

11. A Delay Locked Loop circuit according to claim 8, wherein the output signal of the frequency comparison device is connected to a said control device, via which a second control device is connected between the first control device and a filter device.

12. The Delay Locked Loop circuit according to claim 1, wherein the signal evaluation device has a device for identifying a state change.

13. The Delay Locked Loop circuit according to claim 12, wherein the device for identifying a state change is fed with an input clock signal, the signal Q and two delayed clock signals from the delay device.

14. The Delay Locked Loop circuit according to claim 12, wherein the device for identifying a state change has flip-flops and an EXOR gate.

15. The Delay Locked Loop circuit according to claim 12, wherein the output signal of the state change detection is connected to a second control device, via which a second electrical energy source can be connected between the first electrical energy source and a filter device.

16. The Delay Locked Loop circuit according to claim 15, a frequency comparison device and a device for state change detection connected to said device for generating a signal.

17. The Delay Locked Loop circuit according to claim 16, wherein the output signal of the state detection device is connected to a third control device, via which a the filter device can be discharged.

18. The Delay Locked Loop circuit according to claim 17, wherein the filter device has a capacitor.

19. The Delay Locked Loop circuit according to claim 17, wherein the second and third control devices have an electronic switch.

20. Method for generating at least one delayed clock signal synchronously with an input clock, which is delayed exactly by one period with respect to the input clock signal, having the following steps:

generating at least one delayed clock signal from an input clock signal;

comparing the delayed clock signal with the input clock signal;

generating a first control signal for influencing a delay time of a delay device;

generating a signal Q, whose frequency is proportional to the reciprocal of the delay time of the delay device;

evaluating the signal Q and generating an output signal; and modifying the first control signal in accordance with the output signal.

21. Method according to claim 20, wherein the output signal is generated by a comparison of frequencies of the signal Q, of the input clock and of a clock signal with half the input clock frequency.

22. Method according to claim 20, wherein the output signal is generated by a detection of a state change with inclusion of the signal Q, the input clock and delayed input clock signals.

23. Method according to claim 21, wherein a control device connects a filter device for discharging the filter device to ground if a device for state detection ascertains that no state change occurs.

* * * * *